(12) United States Patent
Vajapeyam (10) Patent No.: US 9,916,086 B2
(45) Date of Patent: Mar. 13, 2018

(54) CONTENT-ADDRESSABLE MEMORY DEVICE

(71) Applicant: Empire Technology Development LLC, Wilmington, DE (US)

(72) Inventor: Sriram Vajapeyam, Karnataka (IN)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 348 days.

(21) Appl. No.: 14/648,692

(22) PCT Filed: Dec. 4, 2013

(86) PCT No.: PCT/US2013/073174
§ 371 (c)(1),
(2) Date: May 29, 2015

(87) PCT Pub. No.: WO2015/030848
PCT Pub. Date: Mar. 5, 2015

(65) Prior Publication Data
US 2016/0026391 A1 Jan. 28, 2016

(30) Foreign Application Priority Data
Aug. 31, 2013 (IN) .......................... 3910/CHE/2013

(51) Int. Cl.
*G06F 12/00* (2006.01)
*G06F 3/06* (2006.01)
(Continued)

(52) U.S. Cl.
CPC .......... *G06F 3/0604* (2013.01); *G06F 3/0659* (2013.01); *G06F 3/0673* (2013.01);
(Continued)

(58) Field of Classification Search
CPC ... G06F 3/0604; G06F 12/0864; G11C 11/56; G11C 15/00
See application file for complete search history.

(56) References Cited

U.S. PATENT DOCUMENTS 5,440,715 A * 8/1995 Wyland ................. G11C 15/00
707/E17.035
6,820,170 B1 11/2004 Elnathan et al.
(Continued)

FOREIGN PATENT DOCUMENTS

EP 0774758 A2 5/1997
EP 1282270 A1 2/2003

OTHER PUBLICATIONS

Micron Hybrid Memory Cube: A Revolution in Memory, accessed at https://web.archive.org/web/20130807061831/http://www.micron.com/about/innovations/hmc, accessed on Apr. 28, 2015, pp. 2.
(Continued)

*Primary Examiner* — Gurtej Bansal
(74) *Attorney, Agent, or Firm* — Turk IP Law, LLC (57) ABSTRACT

Techniques described herein are generally related to storing and retrieving data from a content-addressable memory (CAM). A data value to be stored in the CAM may be received, where the data value has two or more bits. The CAM may include a plurality of memory sets. An index corresponding to the data value may be determined. The index may be determined based on a subset of bits of the data value that correspond to an index bit set. A memory set of the CAM may be identified based on the determined index and the data value may be stored in a storage unit of the identified memory set.

20 Claims, 5 Drawing Sheets

(51) Int. Cl.
*G11C 11/56* (2006.01)
*G11C 15/00* (2006.01)
*G06F 12/0864* (2016.01)

(52) U.S. Cl.
CPC .......... *G06F 12/0864* (2013.01); *G11C 11/56* (2013.01); *G11C 15/00* (2013.01); *G06F 2212/6012* (2013.01); *Y02B 60/1225* (2013.01)

(56) References Cited

U.S. PATENT DOCUMENTS

| | | | | |
|---|---|---|---|---|
| 8,619,451 | B1* | 12/2013 | Argyres | G11C 15/00 365/49.1 |
| 8,856,435 | B1* | 10/2014 | Shih | G11C 15/00 711/100 |
| 2001/0034808 | A1* | 10/2001 | Nakajima | G06F 12/0864 711/3 |
| 2007/0113003 | A1 | 5/2007 | Joshi | |
| 2007/0186036 | A1 | 8/2007 | Bittner, Jr. | |
| 2008/0256094 | A1* | 10/2008 | Gupta | G06F 17/30949 |
| 2008/0276039 | A1 | 11/2008 | Cox et al. | |
| 2010/0228912 | A1 | 9/2010 | Huang et al. | |
| 2014/0006423 | A1* | 1/2014 | Melnychenko | G06F 17/3053 707/749 |

OTHER PUBLICATIONS

Chen, Y. and Oguntoyinbo, O., "Power efficient packet classification using cascaded bloom filter and off-the-shelf ternary CAM for WDM networks," Computer Communications, vol. 32, Issue 2, pp. 349-356 (Feb. 12, 2009).

Cortesi, A., "3 Rules of thumb for Bloom Filters," accessed at http://corte.si/%2Fposts/code/bloom-filter-rules-of-thumb/index.html, posted on Aug. 25, 2010, pp. 4.

Hao, F., et al., "Fast Dynamic Multiset Membership Testing Using Combinatorial Bloom Filters," IEEE INFOCOM 2009, pp. 513-521 (Apr. 19-25, 2009).

Hsieh, J-Y., and Ruan, S-J., "Synthesis and Design of Parameter Extractors for Low-Power Pre-computation-Based Content-Addressable Memory Using Gate-Block Selection Algorithm," Asia and South Pacific Design Automation Conference, 2008, ASPDAC 2008, pp. 316-321 (Mar. 21-24, 2008).

International Search Report and Written Opinion for International Patent Application No. PCT/US2013/073174 dated May 19, 2014.

Lin, C-S., et al., "A low-power precomputation-based fully parallel content-addressable memory," IEEE Journal of Solid-State Circuits, vol. 38, Issue 4, pp. 654-662 (Apr. 2003).

Pagiamtzis, K., and Sheikholeslami, A., "Content-Addressable Memory (CAM) Circuits and Architectures: A Tutorial and Survey," IEEE Journal of Solid-State Circuits, vol. 41, Issue 3, pp. 712-727 (Mar. 2006).

Silbert, S., "Microsoft joins Hybrid Memory Cube Consortium to develop new DRAM standard," accessed at https://web.archive.org/web/20130829215507/http://www.engadget.com/2012/05/09/microsoft-joins-hybrid-memory-cube-consortium/, posted on May 9, 2012, pp. 2.

Tambat, S., and Vajapeyam, S., "Page-Level Behavior of Cache Contention," IEEE Computer Architecture Letters, vol. 1, Issue 1, pp. 9 (Jan.-Dec. 2002).

Taylor, D.E., et al., "Scalable IP Lookup for Internet Routers," IEEE Journal on Selected Areas in Communications, vol. 21, Issue 4, pp. 522-534 (May 2003).

Walter, C., "The QuantumFlow Processor: World's Most Powerful Networking Semiconductor," accessed at https://web.archive.org/web/20120113100036/http://newsroom.cisco.com/dlls/2008/hd_030408b.html, Mar. 4, 2008, pp. 3.

* cited by examiner

300 — DATA VALUES (BITS):
- 11100001
- 11100000
- 11100001
- 11100001
- 11100000
- 11100011
- 11100010
- 11100000

302 —

| BIT POSITION | PERCENTAGE (BIT VALUE-1) | PERCENTAGE (BIT VALUE-0) |
|---|---|---|
| 1 | 100 | 0 |
| 2 | 100 | 0 |
| 3 | 100 | 0 |
| 4 | 0 | 100 |
| 5 | 0 | 100 |
| 6 | 0 | 100 |
| 7 | 25 | 75 |
| 8 | 50 | 50 |

310 —

| INDEX | MEMORY SET |
|---|---|
| 00 | 1 |
| 01 | 2 |
| 11 | 3 |
| 10 | 4 |

| DATA VALUES (BITS) | SEARCH KEY |
|---|---|
| 11100001 | 0001 |
| 11100000 | 0000 |
| 11100001 | 0001 |
| 11100001 | 0001 |
| 11100000 | 0000 |
| 11100011 | 0011 |
| 11100010 | 0010 |
| 11100000 | 0000 |

402 —

| INDEX | MEMORY SET |
|---|---|
| 00 | 1 |
| 01 | 2 |
| 11 | 3 |
| 10 | 4 |

CONTENT-ADDRESSABLE MEMORY DEVICE

CROSS-REFERENCE TO RELATED APPLICATIONS

This Application is a U.S. National Stage filing under 35 U.S.C. § 371 of International Application No. PCT/US13/73174, filed on Dec. 4, 2013, which claims priority under 35 U.S.C. § 119(a) and 119(b) to Indian Application No. 3910/CHE/2013, filed on Aug. 31, 2013. The disclosures of International Application No. PCT/US13/73174 and Indian Application No. 3910/CHE/2013 are herein incorporated by reference in their entireties.

Unless otherwise indicated herein, the approaches described in this section are not prior art to the claims in this application and are not admitted to be prior art by inclusion in this section.

Content addressable memories (CAMs) are sometimes used in processors for storage and access to small data structures such as in translation look aside buffers (TLBs). CAMs are also of use in other contexts such as internet routers, cryptography, and network intrusion detection, among others. CAMs may be used to accelerate applications that perform database searches or detect patterns, such as in database systems, computer and communication networks, and high speed switching systems.

During operation, all rows of the storage array of a CAM may be looked up simultaneously to locate a particular value, as the value may potentially reside in any of the rows of the CAM. A large amount of power and time duration may be required to perform such a lookup. The high power consumption may also result in heat generation that may limit the storage density of the CAM. The present disclosure explores these issues and others.

SUMMARY

Techniques described herein are generally related to storing and retrieving data from a functional content-addressable memory (CAM). Such a functional CAM may be emulated via use of RAMs. The various described techniques may be applied to methods, systems, devices or combinations thereof.

According to some examples of the present disclosure, various methods related to storage of data in a CAM are described. Some example methods may include receiving a data value to be stored in the CAM. The data value may include two or more bits. The CAM may include a plurality of memory sets. An index corresponding to the data value may be determined. The index may be determined based on a subset of bits of the data value that correspond to an index bit set. A memory set of the CAM may be identified based on the determined index and the data value may be stored in a storage unit of the identified memory set.

According to additional examples of the present disclosure, various methods related to retrieval of data from a CAM are described. Some example methods may include receiving a search key that corresponds to a data value to be retrieved from the content-addressable memory (CAM). The search key may include two or more bits. The CAM may include a plurality of memory sets. An index is determined that corresponds to the search key. The determined index may be evaluated to identify a memory set that corresponds to the determined index. The data value from a storage unit of the memory set from the identified memory set may be retrieved.

According to still further examples of the present disclosure, content-addressable memory (CAM) devices are described. Some described CAM devices may include a plurality of memory sets configured to store a plurality of data values. Each memory set may include a plurality of storage units. The CAM devices may further include an index selection module and a memory access module. The index selection module can be configured to determine an index that corresponds to a data value or a search key and to identify a memory set associated with the index of the data value or the search key. The memory access module can be configured to read from or write to a storage unit in the identified memory set of the CAM.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

In the drawings.

all arranged in accordance with at least some embodiments of the present disclosure.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. The aspects of the present disclosure, as generally described herein, and illustrated in the Figures, can be arranged, substituted, combined, separated, and designed in a wide variety of different configurations, all of which are explicitly contemplated herein.

Example embodiments of the present disclosure are generally directed to memory management techniques for a content-addressable memory (CAM). The techniques may facilitate storing and retrieving data from such content-addressable memory with reduced power consumption and enhanced speed of operation as compared to conventional CAMs.

In the described embodiments, a CAM may be organized in memory sets using an index. The index may be based on the data values stored in the CAM. The technique may allow a set-associative cache to be operated as a CAM, and may facilitate efficient filtering and searching operations in such CAMs. The techniques of indexing and searching described below may be utilized in network routers and may facilitate use of such CAMs in processors for supporting applications such as encryption, security, memory access filtering and on-chip traffic filtering.

Figure 1:
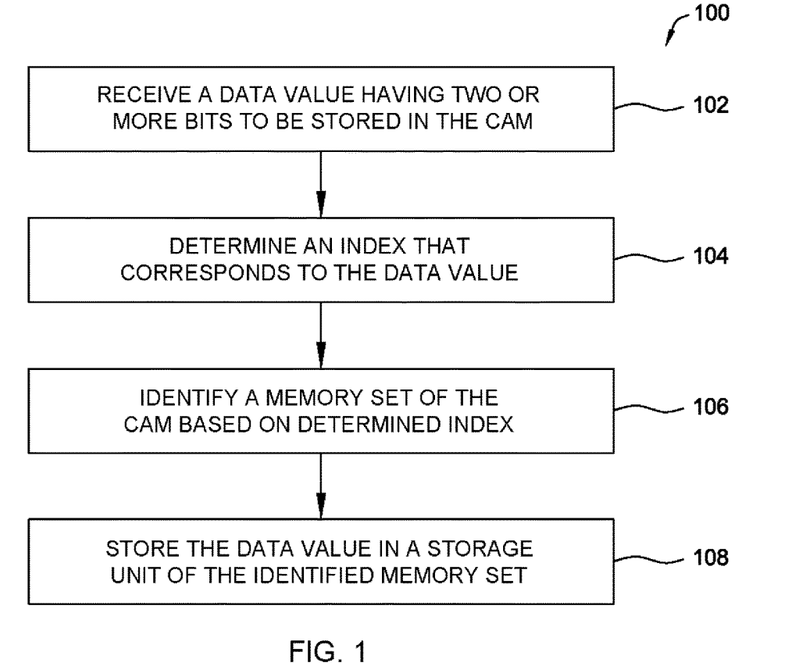
FIG. 1 is an illustration of an example process to store data in a content-addressable memory (CAM) device.

FIG. 1 is an illustration of an example process 100 to store data in a CAM device. Process 100 may include one or more operations, functions or actions as illustrated by one or more of blocks 102-108. Although the blocks are illustrated in a sequential order, these blocks may also be performed in parallel, and/or in a different order than those described herein. Also, the various blocks may be combined into fewer blocks, divided into additional blocks, supplemented with additional blocks that represent other operations, functions, or actions, and/or eliminated based upon the particular implementation. Process 100 may begin at block 102.

At block 102, "RECEIVE A DATA VALUE HAVING TWO OR MORE BITS TO BE STORED IN THE CAM", a data value having two or more bits to be stored in the CAM may be received by a CAM interface. In this example, the CAM may include a plurality of memory sets configured to store a plurality of data values. In one example embodiment, the CAM may be a set-associative SRAM configured for use as a CAM.

Processing may continue from block 102 to block 104, "DETERMINE AN INDEX THAT CORRESPONDS TO THE DATA VALUE". At block 104, an index that corresponds to the data value may be determined by an index selection module of the CAM device. The index may be determined based on a subset of bits of the data value that correspond to an index bit set. In some examples, the index bit set may be determined off-line while the data value is being stored in the CAM device. In this example, the index bit set may be determined by evaluating a plurality of data values stored in the plurality of memory sets of the CAM, and that bit set may be selected as the index from the currently presented data value. The evaluation may include determining a distribution of values at each bit position in the plurality of data values stored in the plurality of memory sets of the CAM. In some examples, the determined index may comprise of the subset of bit values from the data value that correspond to the index bit set.

In certain embodiments, a dedicated processor or a processing thread/process may be utilized to evaluate the distribution of values off-line at each bit position in the data values as the data values are stored in the memory sets of the CAM. The processor may be further configured to select the index based on such distribution. The index may be dynamically selected by the processor and may be utilized for storing the future data values in the plurality of memory sets of the CAM.

In some examples, a population counter may be maintained and updated by the index selection module using the data value to determine the distribution of values stored in the CAM. The value at each bit position of the data value may be evaluated and the population counter may be updated based on the evaluation result. In various examples, a weighted average of the value at each bit position of the data value may be determined and the population counter may be updated based on the determined weighted average. The index may be selected using the population counter as will be described below.

In some examples, bit positions of the data value may be tracked to determine the individual bits of the data values that vary frequently to determine the distribution of values stored in the CAM. These bits may be dynamically selected as the index by the index selection module. In certain embodiments, the selection may be implemented using shift and mask operations on the data value. For example, if bit positions 10, 11, 12 and 13 of the data value are determined to be index bits, a first mask having bit values of 1 in those bit positions and bit values of 0 in other bit positions may be used with the data value to extract the index bits. Subsequently, this result may be right-shifted by 10 positions so that the bit positions 0 through 9 are dropped and the index bits are the least significant 4 bits. These 4 bits may then be selected as the index bits. In other examples, one or more groups of index bits may be identified from the index bit set and the index may be selected from the identified groups of index bits.

In certain embodiments, a table may be maintained by the index selection module to determine value distributions and the table may be updated to track the count of occurrences of different values of index bits of each index bit set. In one embodiment, the count of occurrences may correspond to an exact count of the values of index bits. In other embodiments, a hysteresis counter such as used in CPU branch predictors may be utilized. A variety of other techniques may be envisaged for selecting the index. Based on such distribution analysis, the index may be dynamically selected for storing data values in the memory sets of the CAM.

Processing may continue from block 104 to block 106, "IDENTIFY A MEMORY SET OF THE CAM BASED ON DETERMINED INDEX". At block 106, a memory set of the CAM may be identified based on the determined index by a memory access module of the CAM device. Data values may be stored in any of the plurality of memory sets by the memory access module using the determined index for each data value. The identified memory set corresponds to one of the plurality of memory sets available for storage of data values. In some embodiments, an identified memory set of the CAM may be configured to store a plurality of data values assigned to it based on the index of each data value. In other embodiments, if the identified memory set is not available to store all the assigned data values to that set, overflow data values may be identified and the identified overflow data values may be stored in one or more alternate memory sets of the CAM using a supplementary index that may be determined using other indexing schemes, such as is done in known column-associative caches. For example, if the initial index bits include bit positions 10, 11, 12 and 13, bit positions 8, 9, 12 and 14 may be selected as supplementary index bits.

Processing may continue from block 106 to block 108, "STORE THE DATA VALUE IN A STORAGE UNIT OF THE IDENTIFIED MEMORY SET". At block 108, the data value may be stored in a storage unit of the identified memory set of the CAM. The identified memory set corresponds to one of the plurality of memory sets available for storage of data values. An available memory storage unit in the identified memory set may be identified and the data value may be stored in the identified memory storage unit. This described technique of organizing the data values of the CAM facilitates efficient filtering and searching of data values in the CAM as will be described below.

Figure 2:
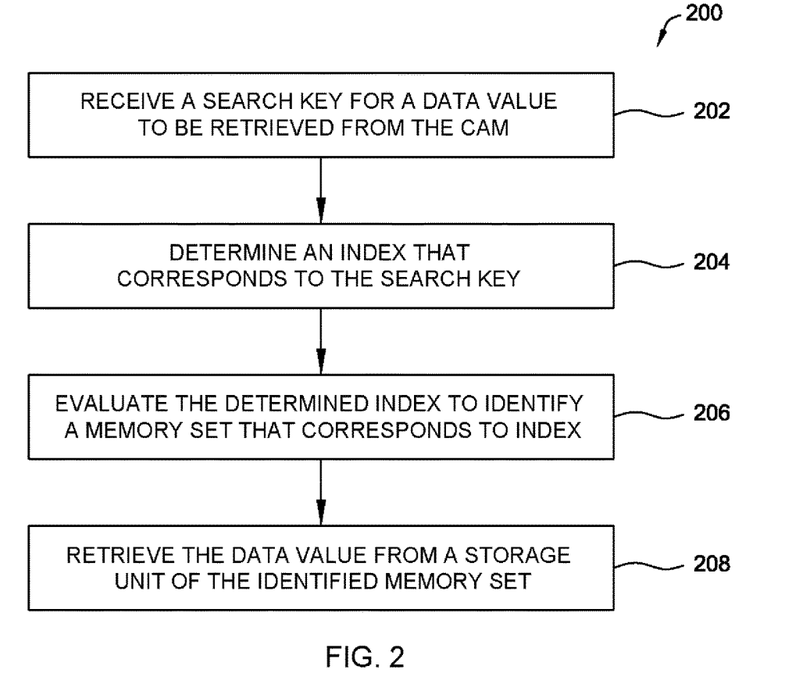
FIG. 2 is an illustration of an example process to retrieve data from a content-addressable memory device.

FIG. 2 is an illustration of a process 200 to retrieve data from a CAM device. Process 200 may include one or more operations, functions or actions as illustrated by one or more of blocks 202-208. Although the blocks are illustrated in a sequential order, these blocks may also be performed in parallel, and/or in a different order than those described herein. Also, the various blocks may be combined into fewer blocks, divided into additional blocks, supplemented with additional blocks that represent other operations, functions, or actions, and/or eliminated based upon the desired implementation. Process 200 may begin at block 202.

At block 202, "RECEIVE A SEARCH KEY HAVING TWO OR MORE BITS FOR A DATA VALUE TO BE RETRIEVED FROM THE CAM", a search key for a data value to be retrieved from the content-addressable memory (CAM) having a plurality of memory sets may be received. In some examples, the search key may be received by the CAM interface of the CAM device. The plurality of memory sets of the CAM may be configured to store data values using dynamic indexes as described with reference to FIG. 1. The search key may include two or more bits. In certain embodiments, the data value corresponding to the search key may correspond to data used during execution of one or more threads by a processing core.

Processing may continue from block 202 to block 204, "DETERMINE AN INDEX THAT CORRESPONDS TO THE SEARCH KEY". At block 204, an index that corresponds to the search key may be determined by the index selection module of the CAM device. In this example, the index is selected from an index bit set stored by an index selection module. As described before, a processor may be configured to determine an index based on a distribution of values at each bit position in the plurality of data values stored in the plurality of memory sets of the CAM and such determined index may be utilized for storing the data values in the plurality of memory sets of the CAM. The determined index corresponding to the search key may be utilized to identify a memory set of the CAM that has the data value corresponding to the search key.

Processing may continue from block 204 to block 206, "EVALUATE THE DETERMINED INDEX TO IDENTIFY A MEMORY SET THAT CORRESPONDS TO THE INDEX". At block 206, the determined index of the search key is evaluated to identify a memory set of the CAM that corresponds to the determined index. The memory set may be identified by the memory access module of the CAM device. Processing may continue from block 206 to block 208, "RETRIEVE THE DATA VALUE FROM A STORAGE UNIT OF THE IDENTIFIED MEMORY SET".

At block 208, the data value corresponding to the search key may be retrieved by the memory access module from a storage unit of the identified memory set of the CAM. In this example, a tag of the search key may be compared to a stored data value to identify the storage unit of the memory set and the data value may be retrieved from the identified storage unit of the memory set.

In certain embodiments, additional techniques may be employed for retrieving data values from the CAM. For example, a Bloom filter may be utilized to determine whether data value corresponding to a search key is present in the CAM when a look-up of the CAM using the determined index of the search key results in a cache miss. If the Bloom filter yet indicates the presence of the data value in the CAM, each of the other plurality of memory sets of the CAM may be looked-up simultaneously for the data value to retrieve the data value. In another example, a Bloom filter for each of the plurality of memory sets may be utilized to identify a potential memory set having the data value when a look-up of the CAM using the determined index of the search key results in a cache miss. A Bloom filter is generally a data structure indexed by the search key that may indicate if a data value is not present in the storage structure such as a cache or a CAM.

Figure 3:
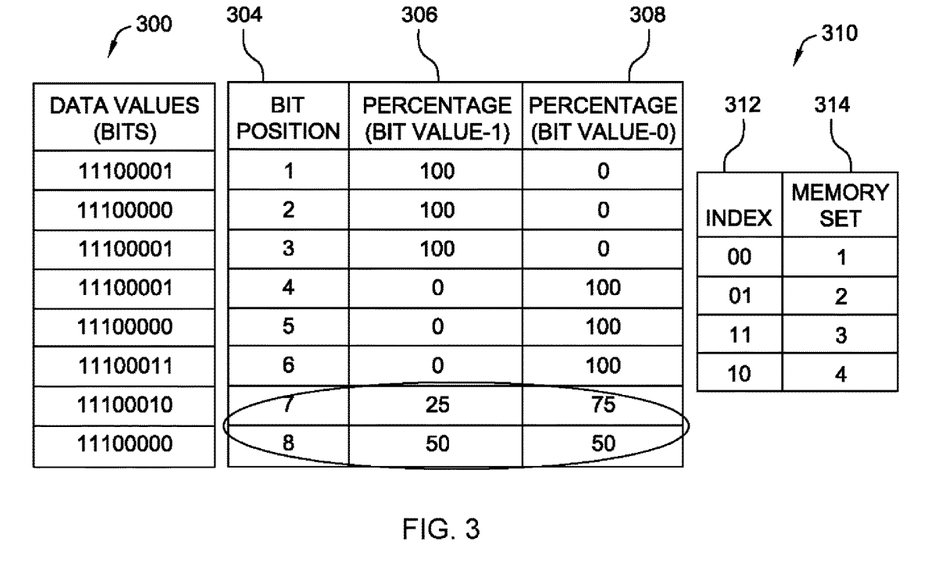
FIG. 3 illustrates example data values stored in a plurality of memory sets of a CAM and a distribution table of values at each bit position in the data values.

FIG. 3 illustrates example data values 300 stored in a plurality of memory sets of a CAM and a distribution table 302 of values at each bit position in the data values. In this example, each of the data values 300 includes eight bits and the values at each bit position of the input data values 300 can be evaluated to generate the distribution table 302.

In this example, the distribution table 302 may include percentages that indicate a number of occurrences of bit value 1 and/or bit value 0 at each bit position in the data values. In FIG. 3, the bit positions of the data values are represented by reference numeral 304, the percentage of occurrences of bit value of 1 at each bit position is represented by reference numeral 306 and the percentage of occurrences of bit value of 0 at each bit position is represented by reference numeral 308. In this example, the value at bit positions 1, 2 and 3 is 1 for all data values 300. Similarly, the value at bit positions 4, 5 and 6 is 0 for all data values 300. However, the value at bit positions 7 and 8 in the illustrated example varies frequently between different data values 300 and therefore these bit positions may be selected as the index bit set. As new data values are stored in the memory sets of the CAM, the index for these values may be selected. The index may comprise of a subset of bit values from the data value that correspond to the index bit set.

Table 310 in FIG. 3 illustrates a mapping between the index and the memory sets of the CAM. The example indexes in table 310 are based on values at bit positions 7 and 8 as represented by reference numeral 312, while the associated memory sets are represented by reference numeral 314.

In some examples, the total number of indexes in the table 310 may be less than or equal to the total number of sets in the set-associative cache configured as a CAM. As data values are received by the CAM, the values that are determined to match the index criterion can be stored in the associated set of the CAM. For example, a data value with index value "00" may be stored in the memory set 1 of the CAM, a data value with index value "01" may be stored in the memory set 2 of the CAM, a data value with index value "11" may be stored in the memory set 3 of the CAM and a data value with index value "10" may be stored in the memory set 4 of the CAM.

Figure 4:
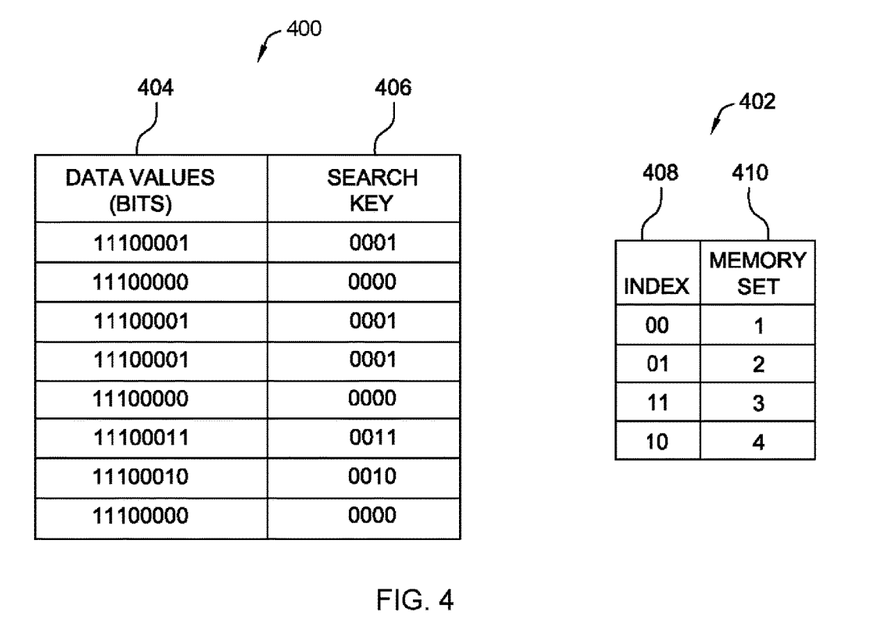
FIG. 4 illustrates example table with search keys with corresponding data values and an index table for index and memory sets associated with index.

FIG. 4 illustrates example table 400 with search keys 406 with corresponding data values 404, and another table 402 that can be used to identify memory sets associated with an index. In this example, bit positions 3 and 4 of search keys 406 may be utilized as the index and other bit positions may be utilized to form a tag of the search key. For example, the index for the search key "0001" may be selected as "01". For example, a subset of data values may be selected such that the search key may include the index bit set. A memory set of the CAM may be identified based on the indexes using the table 402. For example, if the index is "00" the identified memory set may be memory set 1 of the CAM. Similarly, if the index is "01" the identified memory set may be memory set 2 of the CAM. In this example, a tag of the search key may be compared to a stored data value and the data value may be retrieved from the identified storage unit of the memory set.

In one example such as in a network router application, a search key may correspond to a source IP address (e.g.

129.25.64.112) (other search keys may be 129.25.64.110, 129.25.64.95 and so on). The data value may include the search key and additionally, a corresponding destination IP address (e.g. 65.25.78.212). The router may be configured to provide a destination IP address given a source IP address, where the router may store source-destination pairs associated with the CAM. A portion of the source IP address may be used for indexing. The source IP addresses may be stored in associated memory sets of the CAM. Once the CAM set is identified using the index, the entire search key may be matched by the memory access module to identify the associated destination address.

The functional components of an example CAM device will be described with reference to FIG. 5.

Figure 5:
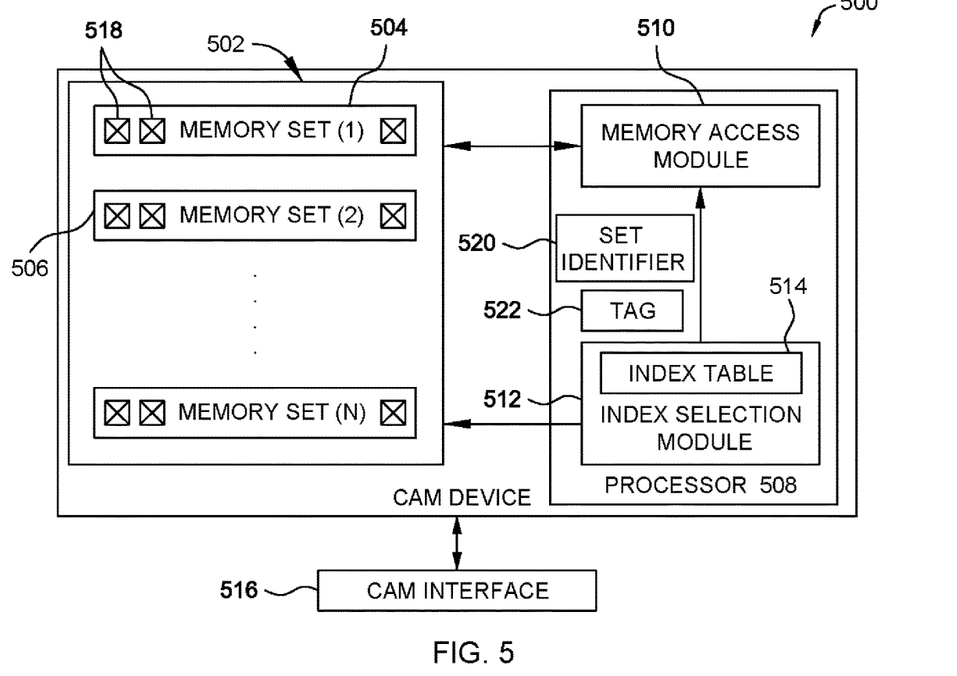
FIG. 5 is a schematic diagram illustrating functional components of an example content-addressable memory device.

FIG. 5 is a schematic diagram illustrating components of an example CAM device 500 arranged in accordance with at least some embodiments of the present disclosure. The CAM device 500 may include a storage portion 502. In this example, the CAM device 500 may include a set-associative static random-access memory. The storage portion 502 may include a plurality of memory sets such as memory set 1-N, represented by reference numerals 504 and 506. Storage portion 502 may be accessible by a processor 508. The processor 508 may include a memory access module 510 and an index selection module 512. In this example, the index selection module 512 may include an index table 514. CAM device 500 may further include a CAM interface 516 that can be used to couple the CAM device 500 to an external device (not shown).

The memory sets of the storage portion 502, such as memory sets 504 and 506 may include one or more storage elements 518. Each storage element 518 may be configured to store a data value. The memory access module 510 may be configured to write to or read from the storage portion 502. The memory access module 510 may be configured to receive a set identifier 520 from the index selection module 512. The memory access module 510 may be configured to utilize the set identifier 520 to access a particular memory set of storage portion 502 (e.g. memory set 504) and also configured to retrieve one or more data values stored in storage elements 518 of the memory set 504.

In some examples, the memory access module 510 may further be configured to receive a tag 522 from the index selection module 512. The memory access module 510 may utilize the tag 522 to select a particular storage element 518 from the plurality of storage elements 518 of a memory set (e.g. memory set 504). The memory access module 510 may further be configured to retrieve a data value stored in the selected storage element 518 and provide it as the retrieved data value over the CAM interface 516.

In some embodiments, the index selection module 512 may be configured to select an index that corresponds to the data value. The index may be determined based on a subset of bits of the data value that correspond to an index bit set. In some examples, the index bit set may be determined by evaluating a plurality of data values stored in the plurality of memory sets of the CAM.

The index may be dynamically selected by the index selection module 512 and may be utilized for storing the data values in the plurality of memory sets (such as 504 and 506) of the storage portion 502. The memory access module 510 may be configured to identify a memory set such as 504 of the storage portion 502 based on the determined index and the data values may be stored using the memory access module 510 in each of the plurality of memory sets using the determined index for each data value.

The index selection module 512 can also be configured to identify a memory set associated with a search key that corresponds to a data value. The index selection module 512 may utilize the index table 514 to determine the set identifier 520 and the memory access module 510 may utilize the set identifier 520 to access a particular memory set of storage portion 502 (e.g. memory set 504) and retrieve one or more data values stored in storage elements 518 of the memory set 504. The storage and retrieval of data values from the CAM device 500 will be described in detail with reference to FIGS. 6 and 7.

Figure 6:
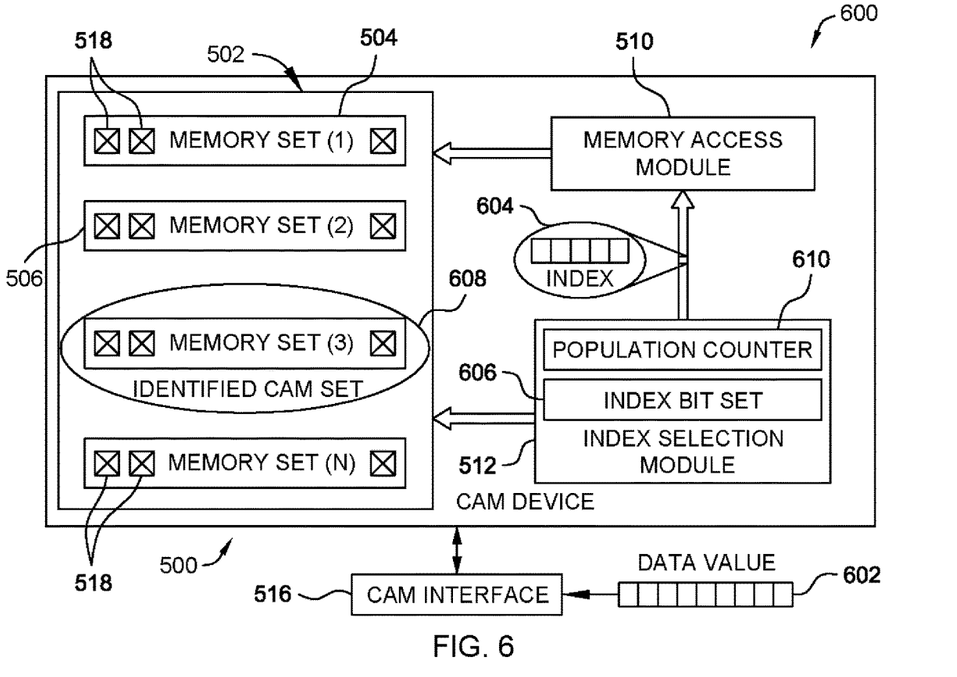
FIG. 6 is a schematic diagram illustrating storage of data values in the content-addressable memory device of FIG. 5.

FIG. 6 is a schematic diagram 600 illustrating storage of data values in the CAM device 500 of FIG. 5. As illustrated, a data value 602 to be stored in the CAM device 500 may be received by the device 500 over the CAM interface 516. In this example, data value 602 may be received by the index selection module 512, which may utilize the received data value 602 to determine an index 604 associated with the data value 602. As data values such as value 602 are received by the index selection module 512, the index selection module 512 may evaluate a plurality of data values stored in the plurality of memory sets such as 504 and 506 to select the index 404 from an index bit set 606 based upon the evaluated distribution.

The index selection module 512 can be further configured to identify a memory set such as memory set 608 of the CAM device 500, where memory set 608 is associated with the index 604 of the data value 602. The selected index 604, along with data value 602, can be utilized by memory access module 510 to store the data value 602 in the identified memory set 608.

In some embodiments, the index selection module 512 may include a population counter 610 configured to compute the distribution of index bits of the plurality of data values stored in the CAM device 500. In one example, a count of occurrence of a value at each bit position of each data value may be determined, where the count of occurrence can be used to update the population counter 610. For example, bit positions of the data value having a value of one may be tracked using the population counter 410. In some examples, support logic can be configured to compute the count of occurrence for each bit position of a data value such that the support logic may identify the individual bits of the data values that vary frequently across entries. The bits that vary frequently across entries could then be dynamically selected to be the determined index 604 instead of a fixed static set of bits. Dynamic selection may be done, in some examples, using shift and mask operations on the data values. As previously described, such selection of index 604 using the population counter may be performed offline while the data values are being stored in the CAM device 500.

In some other examples, the index selection module 512 may be configured to estimate a weighted average of a count of occurrence of a value at each bit position of the data value, and also configured to update the population counter 410 based on the estimated weighted average. The index selection module 512 may be configured to evaluate the count of occurrences and to identify the index 604 based on the comparison result.

The memory access module 510 may be configured to identify the associated memory set 608 with the selected index. The data value 602 associated with the selected index may be stored in the storage unit 606 of the identified memory set 608. In some embodiments, if a memory set cannot store all the data values, overflow data values may be identified and the identified overflow data values may be stored in one or more memory sets of the CAM using a supplementary index (not shown) that may be determined using other indexing schemes such as done in known column-associative caches.

Figure 7:
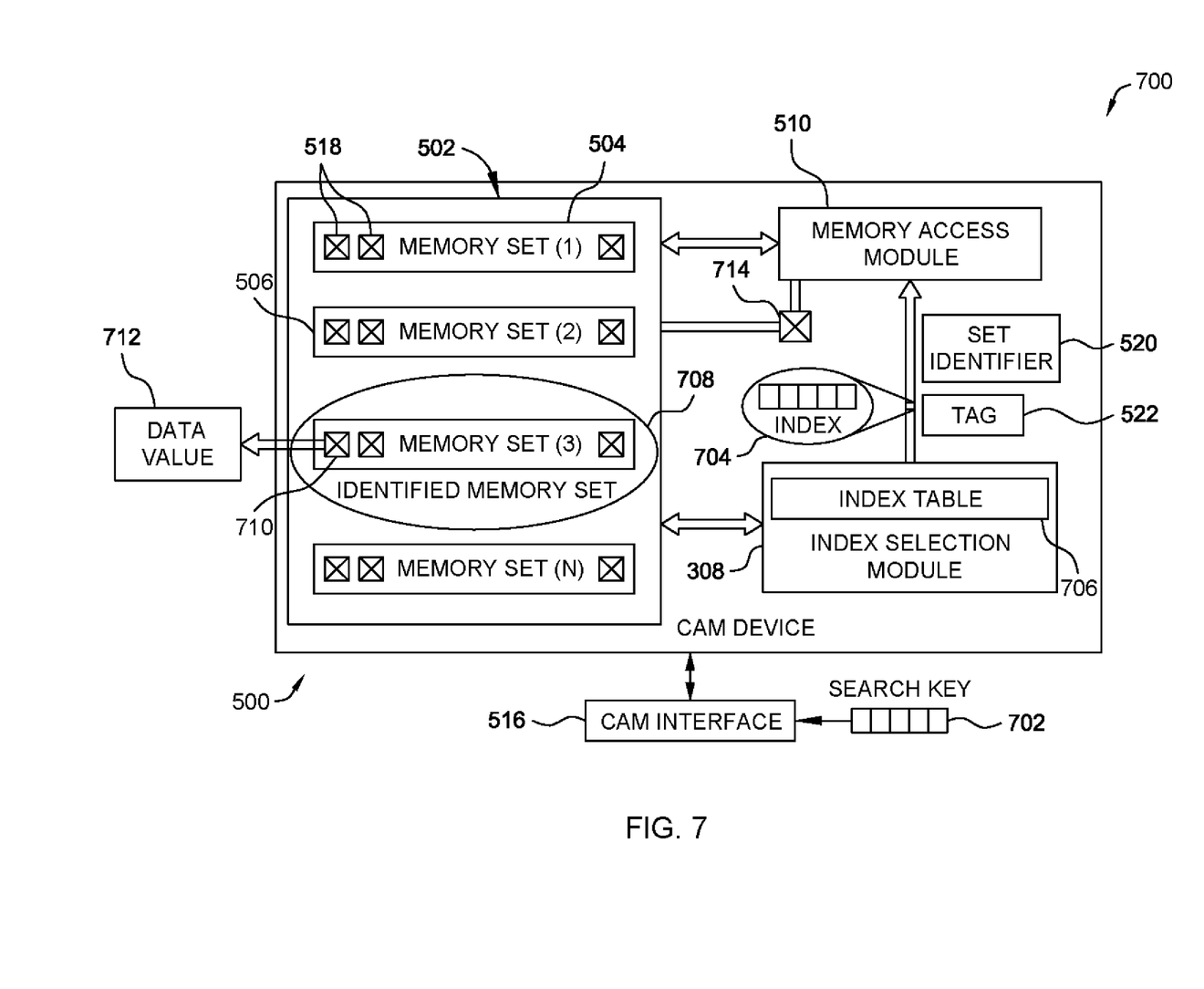
FIG. 7 is a schematic diagram illustrating retrieval of data values from the content-addressable memory device of FIG. 5.

FIG. 7 is a schematic diagram 700 illustrating retrieval of data values from the CAM device 500 of FIG. 5. As illustrated, a search key 702 that corresponds to a data value can be received by the CAM device 500. The search key 702 includes two or more bits. The index selection module 512 may be configured to determine an index 704 that is responsive to the search key 702.

The index selection module 512 can be configured to identify a memory set associated with the search key 702 that corresponds to a data value. The index selection module 512 may utilize the index table 514 to determine the set identifier 520. The memory access module 510 may utilize the set identifier 520 to access a particular memory set of storage portion 502 (e.g. memory set 504) and to retrieve one or more data values stored in storage elements 518 of the memory set 504. Further, the memory access module 510 may be configured to compare the tag 522 of the search key 702 to a stored data value to identify a storage unit 710 of the identified memory set 708 and to retrieve the data value 712 from the storage unit 710.

In certain embodiments, one or more memory sets of the CAM device 500 may not be able to store the data values assigned to them using the indexing technique described above. For example, the data values may be entered into alternate memory sets when the identified memory set overflows and may not be able to store the data values. In various embodiments, a Bloom filter 714 can be used to determine whether the search key is present in the CAM device 500. The Bloom filter 714 may be evaluated either in parallel with the initial cache lookup, or subsequently upon an initial cache miss for the search key 702. If the Bloom filter 714 indicates possible presence of the search key 702, then multiple memory sets of the CAM device 500 may be looked-up for the search key 702.

In some embodiments, a Bloom filter may be used for each memory set of the CAM device 500 to identify a memory set having the search key 502. In some other embodiments, a single Bloom filter may be used for the CAM device to determine if the CAM device should be re-probed for a search value after an initial miss in a primary memory set. In certain other embodiments, additional indexing schemes may be used to enter overflow values from one set into other sets. Such index schemes may be also utilized to probe memory sets of the CAM device 500 for a required search key upon an initial cache miss for the search key.

Figure 8:
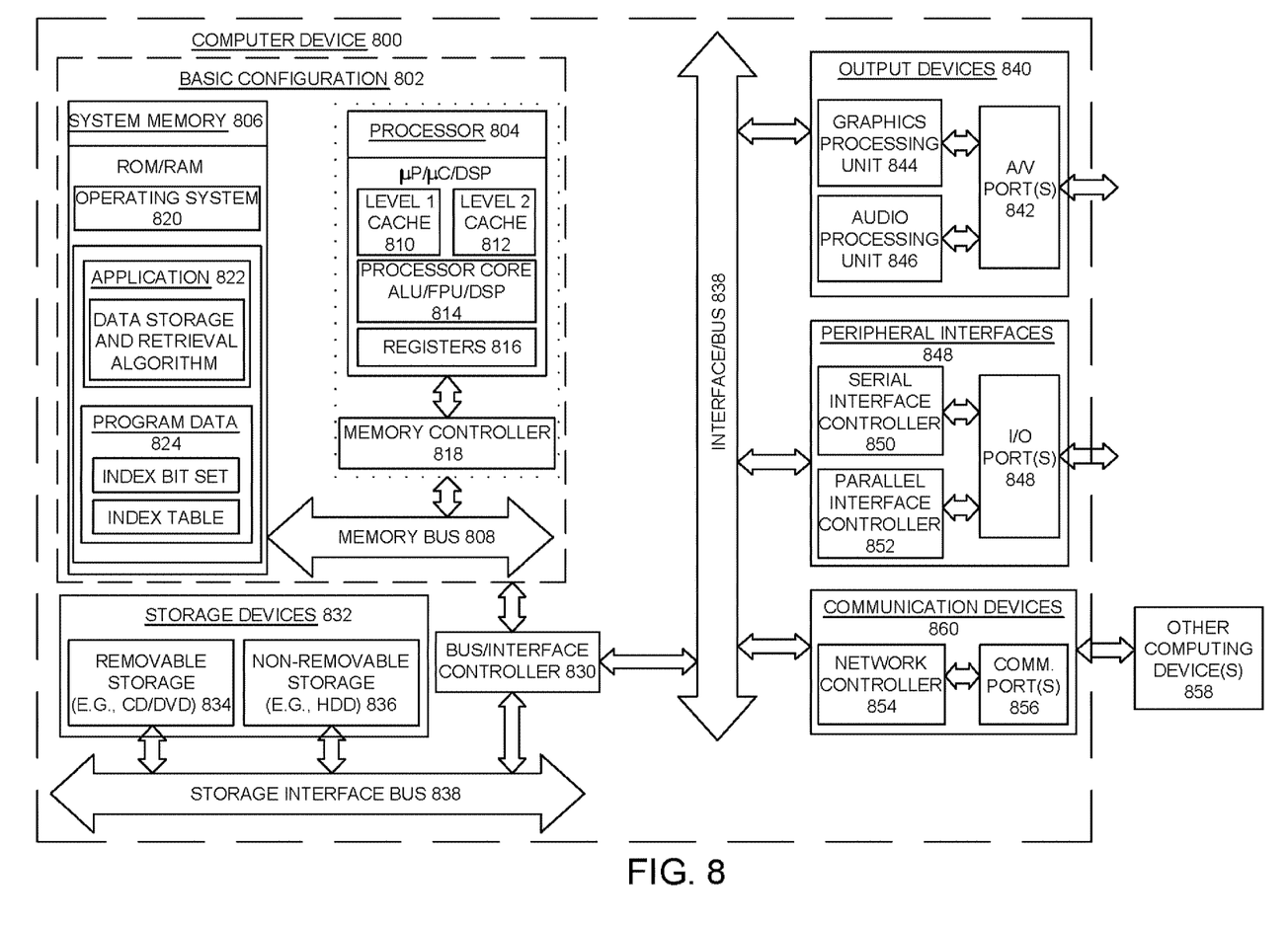
FIG. 8 is a block diagram illustrating an example computing device that is arranged to store and retrieve data from a content-addressable memory device.

Example Computing Device: FIG. 8 is a block diagram illustrating an example computing device 800 in accordance with at least some embodiments of the present disclosure. In a very basic configuration 802, the computing device 800 typically includes one or more processors 804 and a system memory 806. A memory bus 808 may be used for communicating between processor 804 and system memory 806. The processor 804 may include a multi-core processor.

Depending on the desired configuration, processor 804 may be of any type including but not limited to a microprocessor (µP), a microcontroller (µC), a digital signal processor (DSP), or any combination thereof. Processor 804 may include one more levels of caching, such as a level one cache 810 and a level two cache 812, two or more processor cores 814, and registers 816. An example processor core 814 may include an arithmetic logic unit (ALU), a floating point unit (FPU), a digital signal processing core (DSP Core), or any combination thereof. An example memory controller 818 may also be used with processor 804, or in some implementations memory controller 818 may be an internal part of processor 804. One or more caches may be configured to be used as a content-addressable memory (CAM).

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more applications 822, and program data 824. In some embodiments, application 822 may be arranged to operate with program data 824 on operating system 820. This described basic configuration 802 is illustrated in FIG. 8 by those components within the inner dashed line. Application 822 may include algorithm arranged to store and retrieve data values from one or more caches based on index selected based on data values stored in the cache. Program data 822 may include an index bit set and an index table for the data values stored in the caches.

Computing device 800 may have additional features or functionality, and additional interfaces to facilitate communications between basic configuration 802 and any required devices and interfaces. For example, a bus/interface controller 830 may be used to facilitate communications between basic configuration 802 and one or more data storage devices 832 via a storage interface bus 834. Data storage devices 832 may be removable storage devices 836, non-removable storage devices 838, or a combination thereof.

Examples of removable storage and non-removable storage devices include magnetic disk devices such as flexible disk drives and hard-disk drives (HDDs), optical disk drives such as compact disk (CD) drives or digital versatile disk (DVD) drives, solid state drives (SSDs), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 836 and non-removable storage devices 838 are examples of computer storage media. Computer storage media includes, but is not limited to, RAM, ROM, EEPROM, flash memory or other memory technology, CD-ROM, digital versatile disks (DVDs) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 846) to basic configuration 802 via bus/interface controller 830. Example output devices 842 include a graphics processing unit 848 and an audio processing unit 850, which may be configured to communicate to various external devices such as a display or speakers via one or more A/V ports 852.

Example peripheral interfaces 844 include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which may be arranged to facilitate communications with one or more other computing devices 862 over a network communication link via one or more communication ports 864.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 may also be implemented as a personal computer including both laptop computer and non-laptop computer configurations.

The example embodiments described above provide techniques for storing and retrieving data values from memory devices. The technique facilitates associative search of data value within a single set of entries with reduced power consumption as compared to traditional CAM where all sets of entries are searched for a data value. The present technique allows a standard SRAM to function as a CAM with power and performance characteristics similar to the SRAM. The lengths and counts of the search and match lines in a CAM may be used to determine power consumption. Since these lengths and counts are proportional to the number of entries to be searched, searching a small set of the CAM requires relatively less amount of time as compared to the search time for a traditional CAM.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present.

For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.).

It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc.

As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method to store data in a content-addressable memory (CAM) with a plurality of memory sets, the method comprising:
   receiving a plurality of data values to be stored in the CAM, wherein each data value of the plurality of data values has two or more bits;
   determining an index for a data value, of the plurality of data values, wherein:
      determining the index includes evaluating a distribution of bit values at each bit position in the plurality of data values,
      evaluating the distribution of bit values at each bit position includes evaluating a frequency of variation of the bit values at corresponding bit positions in the plurality of data values,
      the index for the data value includes at least one bit of the data value, and
      the at least one bit corresponds to a bit position at which bit values, of the plurality of data values, vary more frequently than bit values at other bit positions;
   identifying, based on the determined index, a memory set from the plurality of memory sets of the CAM; and
   storing the data value in a storage unit of the identified memory set.

2. The method of claim 1, wherein storing the data value comprises identifying an available memory storage location in the storage unit of the identified memory set to store the data value.

3. The method of claim 1, wherein storing the data value in the storage unit of the identified memory set comprises storing the data value in a storage unit of a memory set of a set-associative static random-access memory (SRAM).

4. The method of claim 1, further comprising:
   receiving additional data values to be stored in the CAM;
   identifying overflow data values from the identified memory set of the CAM; and
   storing the identified overflow data values in one or more memory sets of the CAM using a supplementary index.

5. The method of claim 1, further comprising:
   updating a population counter using the plurality of data values; and
   storing the updated population counter.

6. The method of claim 5, wherein updating the population counter comprises:
   evaluating a bit value at each bit position of each data value of the plurality of data values; and
   updating the population counter based on a result of evaluation of the bit value at each bit position of each data value of the plurality of data values.

7. The method of claim 5, wherein updating the population counter comprises:
   determining a weighted average of a bit value at each bit position of each data value of the plurality of data values; and
   updating the population counter based on the determined weighted average.

8. The method of claim 5, wherein determining the index comprises identifying the index based on the population counter.

9. A method to retrieve data from a content-addressable memory (CAM) that includes a plurality of memory sets, the method comprising:
   receiving a search key that corresponds to a data value to be retrieved from the CAM, wherein the search key has two or more bits;
   determining an index that corresponds to the search key, wherein the index includes at least one bit of the data value, and wherein the at least one bit corresponds to a bit position at which bit values, of a plurality of data values stored in the CAM, vary more frequently than bit values at other bit positions;
   evaluating the determined index to identify a memory set from the plurality of memory sets of the CAM, wherein the identified memory set corresponds to the determined index;
   in response to the identification of the memory set, retrieving the data value from a storage unit of the identified memory set; and
   in response to a failure to identify the memory set:
      evaluating a Bloom filter to determine whether the search key is present in the CAM; and
      searching for the search key in each of the plurality of memory sets of the CAM.

10. The method of claim 9, wherein retrieving the data value from the storage unit comprises:
    comparing a tag of the search key to a stored data value in the CAM to identify the storage unit of the memory set; and
    retrieving the data value from the identified storage unit of the memory set.

11. The method of claim 9, wherein searching for the search key in each of the plurality of memory sets comprises:
    evaluating the Bloom filter for each of the plurality of memory sets of the CAM to identify a potential memory set having the search key; and
    retrieving the data value from a storage unit of the potential memory set.

12. A content-addressable memory (CAM) device, comprising:
    a plurality of memory sets configured to store a plurality of data values, wherein each memory set of the plurality of memory sets comprises a plurality of storage units;
    an index selection module operatively coupled to the plurality of memory sets and configured to:
       determine an index that corresponds to a data value or a search key; and
       identify a memory set from the plurality of memory sets associated with the index of the data value or the search key, wherein the index selection module is configured to select the index from an index bit set based on a distribution of bit values at each bit position of each data value of the plurality of data values stored in the plurality of memory sets, wherein the index includes at least one bit of the data value, and wherein the at least one bit corresponds to a bit position at which bit values, of the plurality of data values, vary more frequently than bit values at other bit positions; and a memory access module operatively coupled to the index selection module and configured to read from or write to a storage unit in the memory set of the CAM.

13. The CAM device of claim 12, wherein the index selection module is further configured to store the index bit set.

14. The CAM device of claim 12, wherein the CAM device comprises a set-associative static random-access memory (SRAM).

15. The CAM device of claim 12, wherein to write the data value to the storage unit in the memory set of the CAM, the memory access module is configured to identify the memory set based on an index that corresponds to the data value.

16. The CAM device of claim 12, wherein to read the data value from the storage unit of the memory set, the memory access module is configured to identify the memory set based on an index that corresponds to the search key.

17. The CAM device of claim 12, wherein the memory access module comprises a Bloom filter that is configured to determine whether the search key is present in the CAM device.

18. The CAM device of claim 12, wherein the memory access module comprises a Bloom filter for each memory set of the plurality of memory sets to identify a potential memory set having the search key.

19. The CAM device of claim 12, wherein the index selection module is further configured to update a population counter by use of the plurality of data values.

20. The CAM device of claim 19, wherein to determine the index, the index selection module is configured to:
identify one or more groups of index bits from the index bit set based on the population counter; and
select the index from the identified one of more groups of index bits.

* * * * *

UNITED STATES PATENT AND TRADEMARK OFFICE
CERTIFICATE OF CORRECTION

PATENT NO. : 9,916,086 B2  
APPLICATION NO. : 14/648692  
DATED : March 13, 2018  
INVENTOR(S) : Vajapeyam Page 1 of 3

It is certified that error appears in the above-identified patent and that said Letters Patent is hereby corrected as shown below:

In the Drawings

In Fig. 8, Sheet 5 of 5, delete

" and

Signed and Sealed this  
Third Day of September, 2019

Andrei Iancu  
*Director of the United States Patent and Trademark Office*

CERTIFICATE OF CORRECTION (continued)
U.S. Pat. No. 9,916,086 B2 insert --                                                                                        --, therefor.

In Fig. 8, Sheet 5 of 5, delete "                                                " and

CERTIFICATE OF CORRECTION (continued)
U.S. Pat. No. 9,916,086 B2 insert --  --, therefor.

In the Specification

In Column 1, after Line 14, insert -- BACKGROUND --, as a Heading.

In Column 2, Line 45, delete "device." and insert -- device, --, therefor.

In Column 9, Line 40, delete "key 502." and insert -- key 702. --, therefor.

In Column 10, Line 17, delete "data 822" and insert -- data 824 --, therefor.

In the Claims

In Column 16, Line 16, in Claim 20, delete "one of more" and insert -- one or more --, therefor.